United States Patent
Mahulikar

(10) Patent No.: US 10,364,373 B2
(45) Date of Patent: Jul. 30, 2019

(54) ELEVATED TEMPERATURE CMP COMPOSITIONS AND METHODS FOR USE THEREOF

(71) Applicant: FUJIFILM Planar Solutions, LLC, Mesa, AZ (US)

(72) Inventor: Deepak Mahulikar, Madison, CT (US)

(73) Assignee: FUJIFILM ELECTRONIC MATERIALS U.S.A., INC., North Kingstown, RI (US)

(*) Notice: Subject to any disclaimer, the term of this patent is extended or adjusted under 35 U.S.C. 154(b) by 9 days.

(21) Appl. No.: 15/726,523

(22) Filed: Oct. 6, 2017

(65) Prior Publication Data

US 2018/0100086 A1    Apr. 12, 2018

Related U.S. Application Data

(60) Provisional application No. 62/406,704, filed on Oct. 11, 2016.

(51) Int. Cl.
  C09G 1/02 (2006.01)
  H01L 21/768 (2006.01)
  H01L 21/321 (2006.01)

(52) U.S. Cl.
  CPC ............ C09G 1/02 (2013.01); H01L 21/3212 (2013.01); H01L 21/7684 (2013.01)

(58) Field of Classification Search
  None
  See application file for complete search history.

(56) References Cited

U.S. PATENT DOCUMENTS

| | | | | |
|---|---|---|---|---|
| 6,238,592 B1* | 5/2001 | Hardy | ...................... | C09G 1/02 252/79.1 |
| 6,409,781 B1* | 6/2002 | Wojtczak | .................. | C09G 1/02 106/3 |
| 6,435,947 B2* | 8/2002 | Mueller | ................... | B24B 37/24 257/E21.304 |
| 6,602,436 B2* | 8/2003 | Mandigo | ............. | B24B 37/0056 216/88 |
| 6,630,433 B2* | 10/2003 | Zhang | ...................... | C09G 1/02 252/79.4 |
| 6,638,326 B2* | 10/2003 | Small | ....................... | C09G 1/02 106/3 |
| 6,679,928 B2* | 1/2004 | Costas | ..................... | C09G 1/02 106/3 |
| 9,574,110 B2* | 2/2017 | Graham | ................... | C09G 1/02 |

(Continued)

OTHER PUBLICATIONS

International Search Report dated Dec. 28, 2017 for PCT application No. PCT/US2017/055469.

(Continued)

*Primary Examiner* — Allan W. Olsen
(74) *Attorney, Agent, or Firm* — Ohlandt, Greeley, Ruggiero & Perle, LLP

(57) ABSTRACT

CMP compositions providing stable and robust polishing performance at elevated pad or wafer surface temperatures are disclosed, as well as methods for use thereof. The compositions of the disclosure include reaction rate optimizing (RRO) compounds that optimize various chemical reactions occurring in the slurry chemistry at elevated polishing temperatures on the wafer surface, such that removal rate variation within an individual wafer is <10%.

12 Claims, 7 Drawing Sheets

(56) References Cited

U.S. PATENT DOCUMENTS

| | | | |
|---|---|---|---|
| 2002/0022369 A1* | 2/2002 | Lee | H01L 21/31053 |
| | | | 438/689 |
| 2002/0189169 A1 | 12/2002 | Costas et al. | |
| 2004/0092102 A1 | 5/2004 | Li et al. | |
| 2008/0105652 A1* | 5/2008 | Brusic | C09G 1/02 |
| | | | 216/89 |
| 2009/0095637 A1* | 4/2009 | Toma | B23H 5/08 |
| | | | 205/640 |
| 2009/0095939 A1 | 4/2009 | Chou et al. | |
| 2009/0311864 A1 | 12/2009 | Yamada et al. | |
| 2012/0094487 A1 | 4/2012 | Kranz et al. | |
| 2014/0004626 A1 | 1/2014 | Xu et al. | |
| 2015/0104941 A1* | 4/2015 | Graham | C09G 1/02 |
| | | | 438/693 |
| 2016/0027657 A1* | 1/2016 | Shi | H01L 21/31111 |
| | | | 438/693 |
| 2017/0362466 A1* | 12/2017 | Shi | B24B 37/044 |
| 2018/0100086 A1* | 4/2018 | Mahulikar | C09G 1/02 |

OTHER PUBLICATIONS

Written Opinion dated Dec. 28, 2017 for PCT application No. PCT/US2017/055469.

* cited by examiner

Yohoyama et al Proc Pac Rim CMP MIC 2004

(Prior Art)

Yohoyama et al Proc Pac Rim CMP MIC 2004

(Prior Art)

From Effect of Temp on Cu CMP V R Kakireddy 2007

(Prior Art)

ELEVATED TEMPERATURE CMP COMPOSITIONS AND METHODS FOR USE THEREOF

CROSS-REFERENCE TO RELATED APPLICATION

The present application claims the benefit of U.S. Provisional Application Ser. No. 62/406,704, filed on Oct. 11, 2016, which is herein incorporated by reference.

BACKGROUND OF THE DISCLOSURE

1. Field of the Disclosure

This disclosure relates generally to polishing compositions used in chemical mechanical polishing (CMP) processes. More particularly this disclosure relates to polishing compositions with reaction rate optimizing (RRO) compounds that optimize the uniformity of removal rates during CMP processes.

2. Discussion of the Related Art

Chemical mechanical polishing or planarization (CMP) involves the planarization of different layers on semiconductor wafers using a polishing pad and slurry to polish away excess or unwanted layers of materials prior to construction of subsequent layers. Due to its extraordinary conductivity, copper is a commonly used material for forming interconnects in semiconductor manufacturing. Once a copper inlaid structure is formed by, for example, a damascene process which deposits copper according to the pattern dictated by a stenciled template on the substrate, isolated copper wires are made by polishing and clearing copper and diffusion barrier metal between the inlaid wires. Copper and barrier layer CMP involves the repeated cycle of copper and barrier layer polishing for each layer as the back end of line layers of the chip are fabricated. It is desired to polish the wafers at a high removal rate of material to enhance throughput, while still maintaining favorable wafer characteristics such as a low number of overall defects, especially scratches which are thought to be caused in part by undesirable foreign particles in the slurry.

FIGS. 1a through 1d show a typical polishing process. FIG. 1a shows the wafer substrate with the copper and barrier layers thereon. In a first step (1b), the copper is polished at a high rate to remove the bulk. In the next step, (1c), less downforce is used, to make the chemical layers more level, and to expose some of the barrier layers. In these last two steps, a high-rate polishing slurry is typically used. In the last step (1d), a low removal rate slurry can be used to planarize the substrate and additional layers.

FIG. 2 shows some of the typical defects that can manifest in the wafer after the polishing steps. The copper layer may "dish", meaning that the copper layer is lower than the surrounding barrier layers. "Erosion" refers to the undesired overpolishing of both the copper layer, surrounding barrier layers, and substrate. "Protrusion" can be when not enough of the copper layer is removed.

CMP processes, which are friction and wear processes, generate heat. The CMP pad, which is generally made out of a polymer material, is an insulator. Thus, most of the heat generated during the polishing process is dissipated through the wafer or the slurry. Temperatures on the wafer surface can vary significantly during CMP (Proc 1999 Spring MRS, P. Renteln and T Ninh). Pad surface temperatures can also vary as much as 10 to 15° C. Wafer surface temperatures can reach over 70° C. during polishing. The temperature profile on the wafer surface is dependent on many parameters. The type of pad used, rotational speed, down force, slurry composition and type of platen all contribute to the temperature on the wafer surface. FIGS. 3a through 3c show examples of how temperature can affect removal rate.

The polishing composition also has a very strong contribution to the polishing temperature variation. Most polishing compositions contain abrasive particles and the amount and size of the abrasive particles can influence the friction on the surface of the wafer, thereby raising the temperature. On the other hand, if a polishing composition contains a lubricant then it can reduce the frictional coefficient and hence reduce the temperature.

Some polishing tools like the AMAT Reflexion®, incorporate a cooling mechanism for the platen. Thus, the platen can be optimized to a preset temperature. However, even with this useful tool the wafer and the pad temperatures can vary as much as 5 to 15° C.

The CMP process is a chemical as well as a mechanical process. The chemical portion of the process can include many chemical reactions. The components of the polishing composition can react with copper in a different way, forming different types of oxides, copper complexes, and also result in dissolution of copper and copper oxides to varying degrees. Most chemical reactions are very much temperature sensitive. Reaction rates of most chemical reactions increase with temperature. Thus oxidation, etching, passivation, or dissolution can significantly increase at higher polishing temperatures. If any of these reactions are extremely sensitive to temperature, then it can pose a major issue during copper polishing. As set forth above, wafer surface temperatures can vary significantly during CMP. If the variation is 5 to 15° C., then copper removal on different points on the wafer will be significantly different, resulting in major removal rate variation issues. Indeed, there is one report stating that a 10° C. variation in pad temperature can double the removal rate (Proc 1999 Spring MRS, P. Renteln and T Ninh).

The pH of the polishing composition is also affected by the temperature fluctuation. Most polishing compositions contain abrasive particles like colloidal silica which dissolve in the polishing solution at higher temperatures, thus changing the pH of the polishing composition. A pH variation in polishing compositions can significantly affect removal rates of various layers. Most CMP users require a very tight specification for the pH of the polishing composition. The variation of the pH of the polishing composition is thus a good indicator of removal rate variation at the polishing temperature (H J Kim et al J of Mat Proc Technology, 2002, pages 330-334).

SUMMARY OF THE DISCLOSURE

The present disclosure addresses the issue of removal rate variation caused by the wide range of wafer/pad surface temperatures experienced during CMP. The compositions and methods of the present disclosure provide robust and stable polishing CMP processes within a given polishing temperature range.

In one embodiment, the present disclosure provides CMP compositions including at least one reaction rate optimizing (RRO) compound wherein the RRO compound provides a removal rate variation of less than ten percent (10%) over a wafer surface at a temperature range of forty (40) to sixtyfive (65) degrees Celsius (° C.). The composition also includes an abrasive, an oxidizer, a complexing agent, and a corrosion inhibitor.

In another embodiment, the present disclosure provides methods for minimizing removal rate variation during CMP processes. Such methods can be performed, for example, by applying to a wafer substrate having a surface a composition having at least one reaction rate optimizing (RRO) compound, wherein the RRO provides a removal rate variation of less than 10% over the surface at a temperature range of 40 to 65° C.

DETAILED DESCRIPTION OF THE DISCLOSURE

Figures 1A, 1B, 1C, 1D:
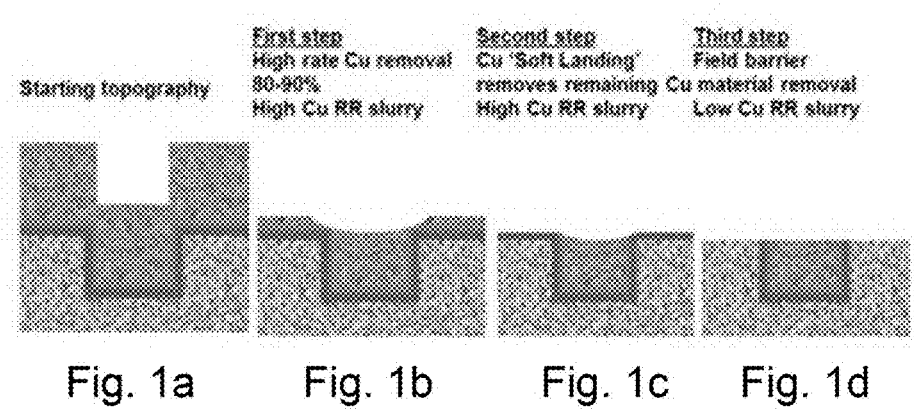
FIGS. 1a through 1d show steps in a common copper CMP process.
Figure 2:
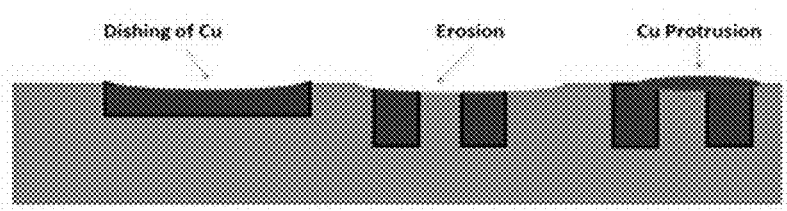
FIG. 2 shows some of the defects that can happen due to high removal rate variation.
Figure 3A:
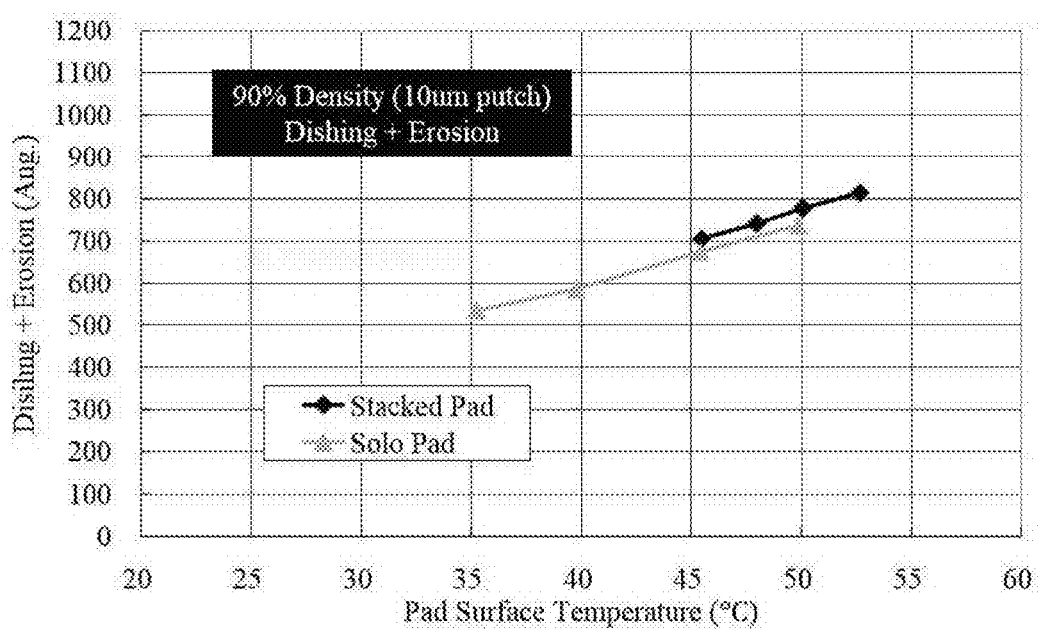
FIG. 3a shows the temperature effect on wafer defects during a typical CMP process.
Figure 3B:
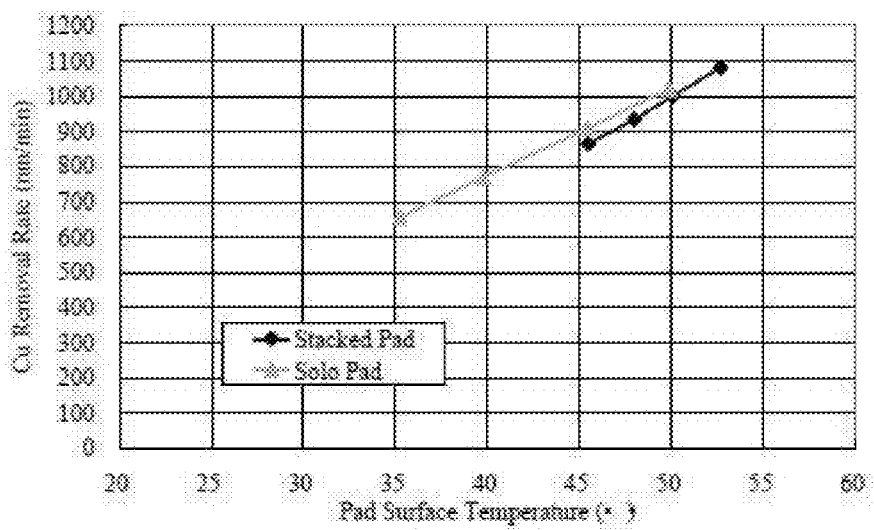
FIGS. 3b and 3c shows the effect temperature on removal rates from typical CMP compositions.
Figure 3C:
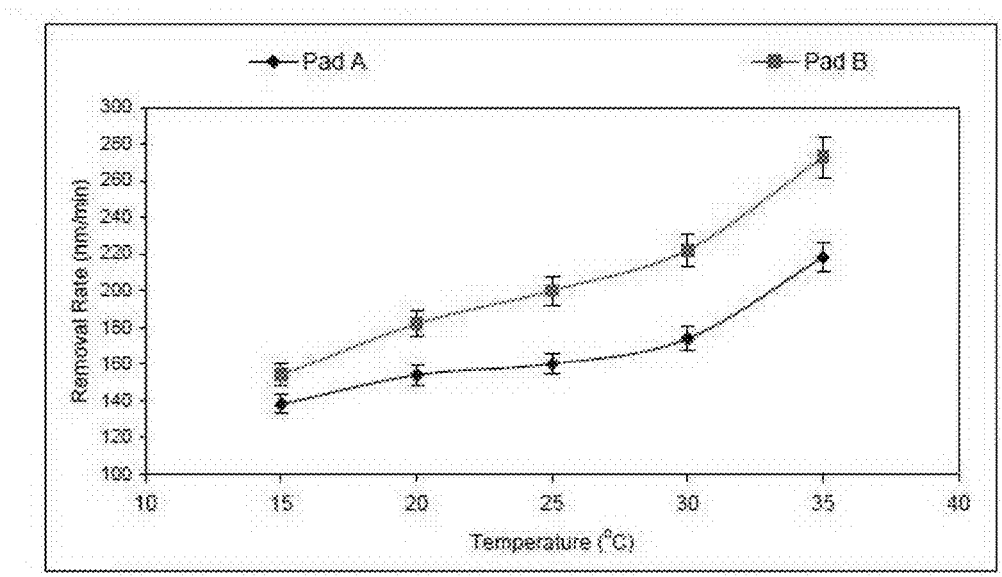

The present disclosure provides polishing compositions and methods of use thereof that provide minimal variation in removal rates over a range of polishing temperatures. As described in greater detail below, the present disclosure achieves this result through use of a removal rate optimizer (RRO) compound. As used herein, "minimal variation" with respect to removal rates is defined as less than about ten percent (10%) variation over a wafer surface for a given temperature range.

It is understood that concentration ranges set forth herein are for polishing compositions which are "point of use" or "ready for use." For concentrated polishing compositions these amounts would be scaled upwards. For example, for 10× concentrate a 10 ppm concentration would become 100 ppm.

The compositions of the disclosure provide robust and stable polishing processes within a given polishing temperature range. In general, polishing temperatures range from 40 degrees Celsius to 65 degrees Celsius. While many different chemical reactions are present with different polishing compositions, for copper CMP processes three common reactions are typically observed: oxidation, complexation and particle dissolution. Dissolution and oxidation are also part of many other CMP processes, including but not limited to oxide, barrier layer, tungsten, and FEOL.

Polishing compositions of this disclosure contain RRO compounds that stabilize a variety of reaction rates at various polishing temperatures. The compositions and methods of the disclosure are useful for copper CMP compositions. In addition, the compositions and methods of the disclosure are useful for other CMP processes such as, for example, oxide, FEOL, tungsten, cobalt, barrier layer, and the like.

As used herein, the phrase "reaction rate optimizing" refers to optimizing oxidation rates, complexation rates, and particle dissolution rates. As used herein, oxidation rates, complexation rates, and particle dissolution rates are "optimized" when they vary less than about 10% over a temperature range of about 40 to about 65 degrees Celsius.

In some embodiments of the disclosure there are provided CMP compositions including at least one reaction rate optimizing (RRO) compound wherein the RRO provides a removal rate variation of less than about 10% over a wafer surface at a temperature range of about 40 to about 65 C.

With multiple chemical reactions taking place at the same time it is important to optimize all the reactions to get low removal rate variation. For example, one would like to keep the dissolution and precipitation of abrasive particles to a minimum. This will allow maximum mechanical removal efficiency. The decomposition reaction of an oxidizer, such as hydrogen peroxide, should be optimized. The decomposition of an oxidizer such as hydrogen peroxide relates to the formation of and the type of oxide on the metal surfaces of the substrate. If the oxide layer is too thin, then nascent copper could be exposed during polishing, resulting in defects. If the oxide layer is too thick, then mechanical removal is adversely affected. The same holds true for the complexing reaction by the complexing agent. The formation and dissolution of the metal complex must be optimized to get an optimized removal rate. Too high or too low reaction rates for each of these mechanisms are not desirable. The reaction rate optimizing compounds have to be selected such that their chemistry as well as the amount must lead to the desirable effects described above.

One function of the RRO compounds disclosed herein is to optimize the dissolution rate of oxide particles in the polishing composition. Most polishing compositions contain colloidal silica nanoparticles ranging from 20 to 100 nm in size. These particles have a very large surface area and thus dissolve in the polishing composition continuously. The dissolution rate is influenced by many factors, including pH, temperature, type of colloidal silica and chemicals in the polishing composition. This dissolution causes ionic changes in the chemistry of the polishing composition, thus affecting the stability of the polishing composition. Optimizing the dissolution rate will affect the removal rates and ultimately the removal rate variation in the CMP process. With the pH changes described above a colloidal silica particle re-precipitation reaction is also likely. This will affect removal rates as well.

RRO compounds used to optimize dissolution of oxide particles (for example, silica particles and the like) include certain buffering agents. The buffering agents include, but are not limited to, a variety of salts. These salts may include basic compounds such as potassium sulfates, potassium nitrates, ammonium sulfates, ammonium nitrates, and other sulfates and nitrates. These compounds may be formed by adding the bases and the acids together or separately. Since these compounds can have a significant impact on the pH of the polishing composition, they are carefully added in small amounts. The total amounts should be just enough to create a buffered solution for the abrasive particles.

In one embodiment, as described in detail below, the RRO can be acids and/or alkalis, present in a concentration range of about 10 to about 10,000 ppm, or any subranges therebetween, with a preferred range of about 10 to about 5000 ppm, or any subranges therebetween. If the salts of the preceding paragraph are used, the concentrations range from about 20 to about 20,000 ppm, or any subranges therebetween. These ranges are essential for the following reasons. Adding very low amounts (<10 ppm) may not have any effect on the pH, but will not carry out the RRO function either. On the higher side, if acids alone are added more than 10000 ppm they will impact pH significantly. Not only that, but the higher acid content (>10000 ppm) will result in metal corrosion. It is believed that >10000 ppm acid will raise the conductivity of the polishing composition and hence certain removal rates (tantalum, Ta, for example) will go up, adversely affecting Cu:Ta polishing selectivity, as one example.

Alkalis have a similar effect, although alkalis such as potassium hydroxide (KOH) have a very strong effect on Ta removal rate as well as the pH. In that case the upper limit is about 5000 ppm. Above that limit, the Ta or TaN removal rate starts to rise, causing a negative effect on planarization efficiency, topography and defects. A higher amount of KOH also affects oxide removal rate adversely.

It should be noted that if both acids and alkalis are added to keep the pH of the composition unchanged, then the conductivity will rise. Above the 10000 ppm limit (i.e. when the maximum amount of both acids and alkalis are used), addition of both these components and the higher conductivity will cause major planarization inefficiency, topography and defect issues, due to corrosion.

In other embodiments, the RRO compound useful for optimizing the dissolution rate of oxide particles is a polymeric solvent. Examples include, but are not limited to, polyalkylene glycols, of which polyethylene glycol and polypropylene glycol are specific examples. In other embodiments, solvents contemplated for use include, but are not limited to, alcohols, for example diols, triols, and polyols, and thiols, or other organic solvents. The solvents described in this paragraph are added in the amounts of about 100 to about 10,000 ppm, or any subranges therebetween. A more preferred range is about 100 to about 5000 ppm, or any subranges therebetween.

Below the lower limit, polymeric, alcohol, and thiol solvents will be ineffective as an RRO. Above the 10000 ppm upper limit, these solvents will start coating the wafer surface. These solvents are very hydrophilic and hence form a layer on various surfaces including copper and oxide. These coatings are classic defect sites called "organic residues", and are very hard to clean. In addition, these coatings will cause other issues like dishing and erosion and pattern dependent non-uniformity. Hence the upper limit of about 10000 ppm in general and about 5000 ppm preferentially.

In other embodiments, the RRO compound is useful for optimizing the decomposition of hydrogen peroxide. Hydrogen peroxide is a commonly used oxidizer for Cu CMP. It is well known that hydrogen peroxide can decompose into water and oxygen and this reaction is strongly affected by temperature, metallic impurities and catalysts. At elevated polishing temperatures in CMP processes, generated Cu ions and metallic impurities in the polishing composition can cause uncontrolled decomposition of hydrogen peroxide and hence non-uniformity of removal rates.

RRO compounds useful to optimize hydrogen peroxide decomposition rates include, but are not limited to, phosphates, sulfates, stannates or ethylenediaminetetraacetic acid (EDTA). It should be noted that sulfates are also capable of optimizing the abrasive particle dissolution rate, and therefore RRO compounds described herein can have at least dual (if not multi)-functionality in the CMP compositions and methods provided herein. In some embodiments, the RRO compounds used to optimize the hydrogen peroxide decomposition rate include inorganic acids, such as for example, sulfuric acid or phosphoric acid. These are typically present in the compositions at a concentration range of about 10 to about 10,000 ppm, or any subranges therebetween.

In other embodiments, RRO compounds disclosed herein are useful are to optimize the corrosion/passivation rates of copper. Corrosion inhibitors (such as benzotriazole, BTA) are added to copper slurries to manage corrosion. Corrosion inhibitors passivate the copper surface and slow oxidation/copper oxide dissolution. However, corrosion inhibitor efficiency can decrease significantly when the operating temperature rises from 25 to 50 degrees Celsius (Copper Corrosion Inhibitors. A review M. M. Antonijevic* and M. B. Petrovic). If wafer or pad temperature varies by 15 degrees Celsius, then the passivation is also expected to be erratic over the wafer surface. This can be optimized by adding certain amines which help form a more durable protective film on copper at higher temperatures. In some embodiments, amines contemplated for use include, but are not limited to, primary, secondary, and tertiary amines like methylamine, ethanolamine, dimethyl amine, and the like. Amines can be added from about 5 to about 10000 ppm. In one embodiment the RRO compound with respect to this function is octadecylamine (ODA). Once again, at amounts lower than 5 ppm, these compounds are ineffective as an RRO, and at and higher than 10000 PPM, they cause in serious metal corrosion as well as increased conductivity of the slurry causing increased removal rate for oxides.

Another important chemical reaction during copper CMP processes involves metal complexation. Typically, an amino acetic acid such as glycine is used in copper slurries. Glycine complexes with copper and helps increase copper removal while keeping barrier layer removal at a minimum. The complex formation involves a redox chemical reaction which reduces Cu(II) to Cu(I). This reaction is significantly affected by temperature changes. This disclosure includes RRO compounds that effectively optimize the complexation of copper. RRO compounds contemplated for use in this aspect of the disclosure include, but are not limited to, inorganic acids such as sulfuric acid, nitric acid and HCl. A typical concentration range for these RRO compounds is about 10 to about 1000 ppm, or any subranges therebetween.

Surprisingly, it was found that all three major chemical reactions in CMP processes (oxidation, complexation, and particle dissolution), which are significantly affected by temperature, can be optimized by using inorganic acids or their salts as RROs. In some embodiments, it was found that addition of sulfuric acid in small quantities can effectively optimize all three reactions at the temperature ranges experienced on wafer surfaces. This finding allows for the use of only one or two RRO compounds (acting in multiple roles) instead of many compounds which could cause other issues with the composition.

Therefore, in some embodiments sulfuric acid is contemplated for use as a RRO compound. In some embodiments, sulfuric acid is present at a concentration range of about 10 to about 10,000 ppm, or any subranges therebetween. In some embodiments, sulfuric acid is present at a concentration range of about 10 to about 1000 ppm, or any subranges therebetween.

The present disclosure contemplates, however, that any of the above-described RROs that are suitable for one of the oxidation, complexation, and particle dissolution reaction enhancements can be used in combination with one another. For example, the compositions of the present disclosure may include one of the sulfates or nitrates discussed above that are suitable for dissolution rate optimization, a phosphate or acid suitable for optimizing hydrogen peroxide decomposition, and a nitric acid suitable for complexation optimization. This is only one example of a combination.

While it is important to keep the rate of dissolution and precipitation of the particles to a minimum, the other reactions (oxidation, complexation or corrosion/passivation) relate to a thickness layer formation on metal (copper) surface. These chemical reactions are kinetic and are dependent on many factors including temperature. All these reactions end up affecting the chemical layer formation on top of the metal. If the metal is copper, for example, the layers can be a copper-amino acetic complex, various oxides or a passivation layer. The Rate of Formation of this layer R is dependent on temperature. If this rate at say 40 degrees Celsius (R40) is significantly different than at 65 degrees Celsius (R65), then one can expect major issues with the removal rates at those two locations. Once these layers are formed, their removal is mostly mechanical (abrasive related). If the mechanical removal rate matches the rate (R) of these reactions, then one can expect uniform removal.

Thus, if RM is the layer removal rate of a layer, then if RM is much greater than or much less than the difference between R65 and R40, this will cause serious removal rate problems. If RM is approximately equal to, or within 10% of the difference between R65 and R40, this is beneficial. The RRO is selected to make this happen.

The CMP compositions of the present disclosure may also include abrasives, oxidizers, complexing agents, corrosion inhibitors, and any combinations thereof, and water q.s. The abrasives can be selected from the group consisting of alumina, fumed silica, colloidal silica, coated particles, titania, ceria, zirconia, or any combinations thereof. In one embodiment, the abrasive is colloidal silica. The abrasives can be present in an amount of about 0.1 wt % to about 30 wt %, or about 0.5 wt % to about 10 wt %, each based on the total amount of the composition, and any subranges therebetween.

The oxidizer can be selected from the group consisting of hydrogen peroxide, ammonium persulfate, silver nitrate (AgNO3), ferric nitrates or chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMnO_4$ inorganic or organic peroxides, and mixtures thereof. In one embodiment, the oxidizer is hydrogen peroxide. The oxidizer can be present in an amount of about 0.1 wt % to about 5 wt % of oxidizer, or from about 0.4 wt % to about 2 wt %, based on the total weight of the composition, and any subranges therebetween.

The complexing agent can be any compound that performs the desired function. In one embodiment, the complexing agent is selected from the group consisting of organic acids and their salts, amino acetic acids, amino acids such as glycine or alanine, carboxylic acids, polyamines, ammonia based compounds, quaternary ammonium compounds, inorganic acids, compounds with both carboxylic and amino functions, such as ethylenediaminetetraacetic acid and diethylene triamine pentaacetic acid, and mixtures thereof. In another embodiment, the complexing agent is glycine. The complexing agent can be present in an amount of about 1 wt % to about 20 wt %, or about 5 wt % to about 13 wt %, each based on the total weight of the composition, or any subranges therebetween.

The corrosion inhibitor can be selected from the group consisting of benzotriazole and its derivatives, tolyl triazole and its derivatives, and azoles, certain surfactants, and mixtures thereof. In one embodiment, the corrosion inhibitor is a benzoriazole derivative. The corrosion inhibitor can be present in an amount about 10 parts per million (ppm) to about 1000 ppm, or from about 10 ppm to about 200 ppm, based on the total weight of the composition, or any subranges therebetween.

The disclosure is illustrated in more detail with reference to the following examples, which are for illustrative purposes and should not be construed as limiting the scope of the disclosure.

EXAMPLES

The following examples demonstrate that polishing compositions of the disclosure provide stable and robust CMP processes when wafer surface temperatures vary up to 15° C.

Example 1

Figure 4:
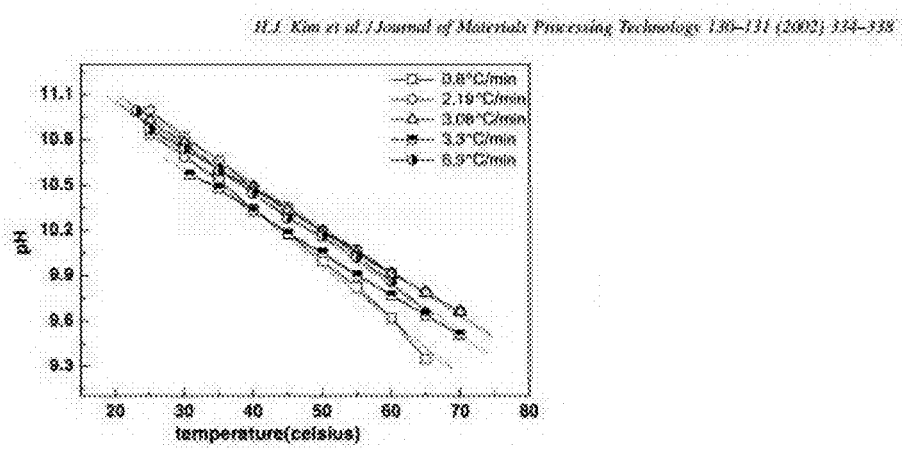
FIG. 4 shows the effect of temperature on the pH of a typical polishing composition.
Figure 5A:
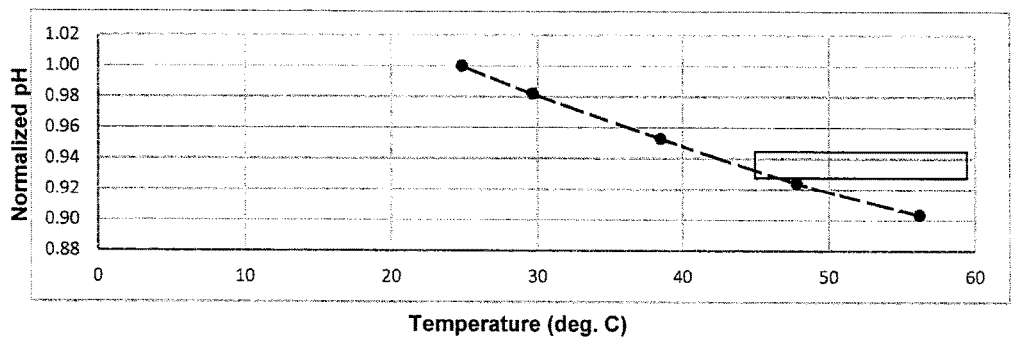
FIG. 5a shows the data of FIG. 4, normalized to a room temperature pH.
Figure 5B:
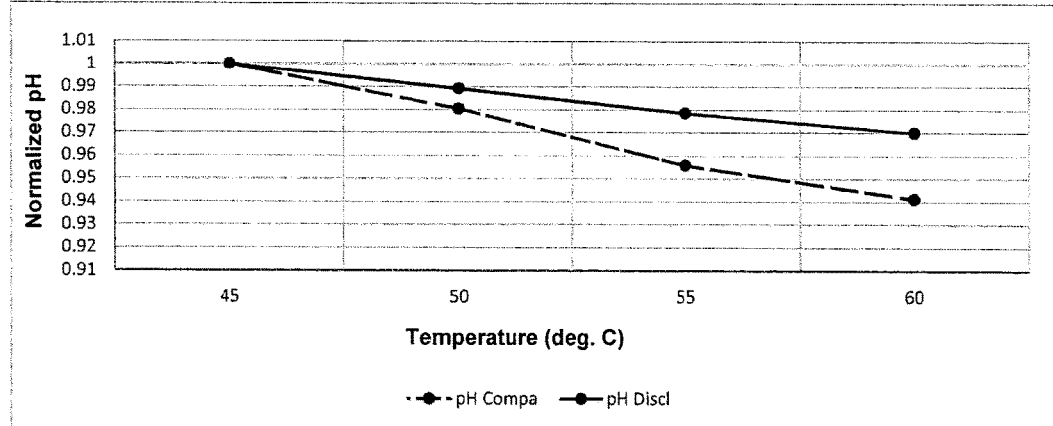
FIG. 5b shows pH data comparing the composition of the present disclosure with that of the prior art.

A copper polishing composition was formulated using a silica abrasive, a complexing agent, a corrosion inhibitor, and a reaction rate optimizing (RRO) compound. In this example the RRO was sulfuric acid in an amount of about 20 ppm. The pH of this composition was measured using standard pH measurement techniques described in the literature at various temperatures starting with room temperature. The data for the temperature range of interest is shown in FIGS. 5a and 5b. The temperature range of interest is believed to be the temperatures experienced on various parts of the polished wafer, i.e. between 45° C. and 60° C. The data in FIG. 5a is the data of FIG. 4 normalized to the room temperature pH.

As can be seen from the data, the pH variation for this polishing composition was less than 5% (or less than 0.2 pH units) as in the highlighted box. As was shown in FIG. 4, the prior art data shows significantly more variation of pH with temperature. This is plotted in FIG. 5b to show the comparison between the polishing composition of this disclosure and the known compositions. As the data in FIG. 5b illustrates, compositions of the present disclosure including a RRO can help to limit pH variation.

Example 2

The polishing composition from Example 1 was used to polish both blanket and patterned copper wafers using the following parameters:
Tool: AMAT Mirra
Down force: about 3 PSI
Pad: IC 1000

Removal rate variation over the entire wafer surface was measured. The resulting variation was less than 5%.

As described herein, known CMP slurries exhibit much higher removal rate variations, i.e., >20%

TABLE 1

|  | Comp. Ex 1 Ref 12 | Comp Ex 1 Ref 12 | Comp Ex 2 Ref 13 | Comp Ex 3 Ref 14 | This Disclosure |
|---|---|---|---|---|---|
|  | Pad A | Pad B | Various Polish Conditions | Various Down Forces | Various polish conditions |
| WIWNU | ~35% | ~25% | >20% | >20% | <5% |

WIWNU = Within Wafer Non-Uniformity

Example 3

Another copper polishing composition was formulated including hydrogen peroxide as an oxidizer, a copper complexing agent, a corrosion inhibitor and two RRO compounds in the form of an alcohol (300 ppm) and an alkali KOH (25 ppm). Using the same polish parameters described in Example 2 both blankets and patterned copper wafers were polished and removal rate variation was measured. The removal rate variation over the entire wafer surface was less than 5%.

While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A CMP composition, consisting of:
   an abrasive;
   an oxidizer;
   a complexing agent, wherein the complexing agent is selected from the group consisting of amino acids, carboxylic acids, polyamines, ammonia based compounds, quaternary ammonium compounds, inorganic acids, and any combinations thereof;
   a corrosion inhibitor;
   at least one reaction rate optimizing compound, wherein the reaction rate optimizing compound is at least one selected from the group consisting of potassium sulfates, potassium nitrates, ammonium sulfates, ammonium nitrates, polymeric solvents, alcohols, thiols, phosphates, sulfates, stannates, EDTA, sulfuric acid, salts of sulfuric acid, phosphoric acid, salts of phosphoric acid, nitric acid, salts of nitric acid, hydrochloric acid, salts of hydrochloric acid, amines, KOH, ammonia, and any combinations thereof; and
   water,
   wherein the concentration of the reaction rate optimizing compound in the composition is from about 10 to about 10000 ppm;
   wherein the reaction rate optimizing compound is selected so that the composition exhibits a removal rate variation of less than about 10% over a wafer surface at a temperature range of about 40 degrees Celsius to about 65 degrees Celsius, and
   wherein the composition has a pH value that varies less than 0.3 units between about 45 degrees Celsius and about 65 degrees Celsius.

2. The polishing composition of claim 1 wherein the reaction rate optimizing compound optimizes dissolution or precipitation of abrasive particles in the polishing composition.

3. The polishing composition of claim 1 wherein the reaction rate optimizing compound optimizes oxidation or passivation of metal surfaces.

4. The polishing composition of claim 1 wherein the reaction rate optimizing compound optimizes complexation of metal surfaces.

5. The polishing composition of claim 1 wherein the reaction rate optimizing compound is at least one selected from the group consisting of sulfuric acids and salts thereof.

6. The polishing composition of claim 1 wherein the concentration of the reaction rate optimizing compound in the composition is from about 10 to about 1000 ppm.

7. The polishing composition of claim 1, wherein the abrasive is selected from the group consisting of alumina, fumed silica, colloidal silica, coated particles, titania, ceria, zirconia, and any combinations thereof, and is present in an amount of about 0.2 wt % to about 30 wt %.

8. The polishing composition of claim 1, wherein the oxidizer is selected from the group consisting of hydrogen peroxide, ammonium persulfate, silver nitrate, ferric nitrates, ferric chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMnO_4$, and any combinations thereof, and is present in an amount of about 0.1 wt % to about 5 wt %.

9. The polishing composition of claim 1, wherein the complexing agent is present in an amount of about 1 wt % to about 20 wt %.

10. The polishing composition of claim 1, wherein the corrosion inhibitor is one or more azoles, and is present in an amount of about 10 parts per million to about 1000 ppm.

11. A CMP composition, consisting of:
    an abrasive;
    an oxidizer;
    a complexing agent, wherein the complexing agent is selected from the group consisting of amino acids, carboxylic acids, polyamines, ammonia based compounds, quaternary ammonium compounds, inorganic acids, and any combinations thereof, and;
    a corrosion inhibitor;
    at least one reaction rate optimizing compound, wherein the reaction rate optimizing compound comprises sulfuric acid in an amount of 10 to 10000 parts per million, based on the total weight of the composition; and
    water,
    wherein the composition exhibits a removal rate variation of less than 10% over a wafer surface at a temperature range of 40 degrees Celsius to 65 degrees Celsius, and
    wherein the composition has a pH value that varies less than 0.3 units between about 45 degrees Celsius and about 65 degrees Celsius.

12. The CMP composition of claim 11, wherein the reaction rate optimizing compound comprises sulfuric acid in an amount of 10 to 1000 parts per million, based on the total weight of the composition.

* * * * *